US007802998B2

(12) United States Patent
Taguchi et al.

(10) Patent No.: US 7,802,998 B2
(45) Date of Patent: Sep. 28, 2010

(54) ELECTRIC CONNECTION BOX

(75) Inventors: Naoto Taguchi, Makinohara (JP); Yusuke Matsumoto, Makinohara (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 12/581,439

(22) Filed: Oct. 19, 2009

(65) Prior Publication Data

US 2010/0105223 A1 Apr. 29, 2010

(30) Foreign Application Priority Data

Oct. 23, 2008 (JP) .......................... P.2008-273346

(51) Int. Cl.
*H01R 12/00* (2006.01)
*H05K 1/00* (2006.01)

(52) U.S. Cl. ...................................... 439/76.2; 439/949

(58) Field of Classification Search ................ 439/76.2, 439/733.1, 949

See application file for complete search history.

(56) References Cited

U.S. PATENT DOCUMENTS 7,549,872 B2 * 6/2009 Akahori et al. ............ 439/76.2
7,566,230 B2 * 7/2009 Ozawa et al. .............. 439/76.2
7,614,886 B2 * 11/2009 Choi .......................... 439/76.2
7,666,006 B2 * 2/2010 Hashikura et al. .......... 439/76.2

FOREIGN PATENT DOCUMENTS

JP 2007-282399 10/2007

* cited by examiner

*Primary Examiner*—Khiem Nguyen
(74) *Attorney, Agent, or Firm*—Morgan, Lewis & Bockius LLP

(57) ABSTRACT

There is provided an electric connection box, including: a terminal mounting portion which includes a connection portion and a fastening portion provided on the connection portion; a metal terminal slid to be held and fixed between the connection portion and the fastening portion; a pair of restricting walls which are upstandingly provided on the connection portion, and abut respectively against opposite side edges of the metal terminal to restrict the rotation of the metal terminal; a retaining rib which is disposed on a surface of the connection portion and projects from the surface; and a retaining groove which is formed in the metal terminal, and is engaged with the retaining rib to prevent the metal terminal from being disengaged from the connection portion.

5 Claims, 7 Drawing Sheets

ELECTRIC CONNECTION BOX

BACKGROUND OF THE INVENTION

1. Technical Field

The present invention relates to an electric connection box which is mounted on a vehicle and to which a metal terminal of a wire installed on the vehicle is connected.

2. Background Art

An electric connection box which is the generic name for a fuse block, a relay box and a junction block and receives therein various electrical parts such as fuses, relays, bus bars is mounted on a vehicle. As shown in FIG. 8, such an electric connection box 500 includes a box body 501, a metal terminal 503, etc. The box body 501 includes a body portion 505, a plurality of cassette blocks 507, an upper cover (not shown), and a lower cover 509. The body portion 505 is made of an insulative synthetic resin, and is molded by a well-known injection molding method. The cassette blocks 507 are formed into a box-like shape, and are so sized as to be received within the body portion 505.

Electrical parts such as relays 511, fuses 513 and so on are mounted on upper surfaces 507*a* of the cassette blocks 507. Further, a terminal mounting portion 515 is provided at the surface of one of the cassette blocks 507. A pair of opposed lock projections 517, 517 are formed on the body portion 505, and a rotation prevention projection 519 is provided between the lock projections 517 and 517. When the cassette block 507 having the terminal mounting portion 515 is incorporated into the body portion 505, the rotation prevention projection 519 shown in FIG. 9 is disposed between the lock projections 517 and 517.

As shown in FIG. 10, the metal terminal 503 is formed into a one-piece, and includes a flat electrical contact portion 521, a reinforcing bridge portion 523, a wire connection portion 525, and an upstanding piece portion 527. The electrical contact portion 521 of the metal terminal 503 is superposed on a metal plate member 529 of the terminal mounting portion 515, and a bolt 531 is passed through a notch 533 formed in the electrical contact portion 521, and is threaded into a nut (not shown) disposed under the metal plate member 529. By doing so, the metal terminal 503 is mounted on the terminal mounting portion 515, with the electrical contact portion 521 held between the metal plate member 529 and a head 531*a* of the bolt 531.

The electrical contact portion 521 is slid in a direction K along a longitudinal direction of the notch 533, and a threaded portion of the bolt 531 provided at the terminal mounting portion 515 is passed through the notch 533, and the electrical contact portion 521 is pushed into the terminal mounting portion 515 until the threaded portion is brought into abutting engagement with an inner end 533*a* of the notch 533. By doing so, the electrical contact portion 521 is inserted between the metal plate member 529 of the terminal mounting portion 515 and the head 531*a* of the bolt 531. At this time, upstanding portions 535 and 535 of the metal terminal 503 slide respectively over the lock projections 517 and 517, and are retained respectively by the lock projections 517 and 517 from opposite sides, and also the rotation prevention projection 519 is fitted into the notch 533 through an entry port formed by the upstanding portions 535 and 535 and an interconnecting portion 537, so that the metal terminal 503 is provisionally fixed. Then, the bolt 531 is tightened, so that the electrical contact portion 521 is held between the head 531*a* of the bolt 531 and the metal plate member 529, thereby fixing the metal terminal 503 to the terminal mounting portion 515. By doing so, the rotation of the metal terminal 503 due to the rotation of the bolt 531 during the bolt-tightening operation can be effectively prevented (see JP-A-2007-282399).

In the above usual electric connection box 500, when inserting the metal terminal 503 into the terminal mounting portion 515, the upstanding portions 535 and 535 are pressed respectively against the pair of lock projections 517 and 517 formed at the body portion 505, and are slid respectively over the lock projections 517 and 517, and then are retained respectively at the rear sides of the lock projections 517 and 517, and by doing so, the rotation of the metal terminal 503 due to the rotation of the bolt during the bolt-tightening operation is prevented. Therefore, at the time when the metal terminal 503 is slid to be inserted into the terminal mounting portion 515, an inserting force for elastically deforming the lock projections 517 and 517 is required, and the operation often lowers the efficiency. Furthermore, with the lock structure utilizing the elastic force, it is difficult to obtain a high retaining force, and the retained condition of the metal terminal is liable to be canceled, and also wear and fatigue occurred when the operation is repeated, and this leads to a fear that the retaining force might be lowered.

SUMMARY OF THE INVENTION

This invention has been made in view of the above circumstances, and an object of the invention is to provide an electric connection box in which the force for pushing the metal terminal so as to elastically deform the lock projections is not needed, thereby enhancing the efficiency of the operation, and besides as compared with the lock structure utilizing the elastic force, the retaining force can be made higher, and fatigue due to the repeated operations will not occur, and the retaining force will not be lowered.

The above object of the present invention has been achieved by the following constructions.

An electric connection box includes: a terminal mounting portion which includes a connection portion and a fastening portion provided on the connection portion; a metal terminal slid to be held and fixed between the connection portion and the fastening portion; a pair of restricting walls which are upstandingly provided on the connection portion, and abut respectively against opposite side edges of the metal terminal to restrict the rotation of the metal terminal; a retaining rib which is disposed on a surface of the connection portion and projects from the surface; and a retaining groove which is formed in the metal terminal, and is engaged with the retaining rib to prevent the metal terminal from being disengaged from the connection portion.

In the electric connection box, when the metal terminal is inserted between the fastening portion and the connection portion, a lower surface of a front portion of the metal terminal slides on the retaining rib, and then when the metal terminal reaches a predetermined position, the retaining groove is disposed in registry with the retaining rib, and the retaining rib is fitted into the retaining groove, so that the metal terminal is moved toward the connection portion, thereby preventing the metal terminal from moving in the inserting/withdrawing direction (that is, retaining the metal terminal against movement in the inserting/withdrawing direction). Therefore, a force for pushing the metal terminal so as to elastically deform the lock projections as in the usual structure is not needed. And besides, as compared with the usual lock structure utilizing the elastic force, a higher retaining force can be obtained, and also fatigue due to repeated operations is less liable to occur.

In the electric connection box, the retaining rib may be formed on and project from the surface of the connection portion.

In the electric connection box, the retaining rib is formed on and projects from the surface of the connection portion, and the strength of the retaining rib in the terminal withdrawing direction is increased. The retaining rib can be formed by part of an electrically-conductive metal sheet forming the connection portion. In another alternative, the retaining rib can be formed on a resin body integrally molded on the electrically-conductive metal sheet forming the connection portion.

In the electric connection box, the retaining rib may project from the restricting wall and be disposed on the surface of the connection portion.

In this electric connection box, the retaining rib projects from an inner surface of the restricting wall, and is disposed on the electrically-conductive metal sheet forming the connection portion. Namely, the electrically-conductive metal sheet and the retaining rib are not fixed to each other. The retaining rib can be disposed at an intermediate portion of the rearwardly-extending electrically-conductive metal sheet, and the electrically-conductive metal sheet having an arbitrary wide area which is not limited by the position of the retaining rib can be provided.

In the electric connection box, a pair of the retaining ribs may be provided respectively at opposite side portions of the connection portion such that the fastening portion is disposed generally midway between the pair of retaining ribs.

In the electric connection box, when the metal terminal is to be inserted between the connection portion and the fastening portion, opposite side edge portions of the lower surface of the metal terminal slide respectively on the left and right retaining ribs, and the metal terminal is inserted without being inclined in the left-right direction relative to the connection portion. Therefore, as compared with the case where there is provided only one retaining rib, and the metal terminal is inserted while inclined in one direction, the metal terminal is less liable to interfere with the fastening portion, so that the inserting operation can be carried out efficiently.

In the electric connection box, the retaining rib may be provided at a position between an entrance for inserting the metal terminal into the terminal mounting portion and the fastening portion.

In the electric connection box, the retaining rib is thus at a position between an entrance of the metal terminal into the terminal mounting portion and the fastening portion. With this arrangement the retaining rib can be easily confirmed with the eyes, and for example as compared with the case where the retaining rib is disposed at an inner portion of the connecting portion in the terminal inserting direction, the metal terminal, when inserted, will not abut against the retaining rib and will not be caught by the retaining rib, so that the inserting operation can be carried out efficiently.

In the electric connection box of the present invention, the retaining rib is disposed on the surface of the connection portion, and the retaining groove for engagement with the retaining rib is formed in the metal terminal. Therefore, when the metal terminal is inserted into the predetermined position between the fastening portion and the connection portion, the retaining groove is disposed in registry with the retaining rib, and is engaged therewith, thereby retaining the metal terminal against withdrawal without the need for elastic deformation for locking purposes. Therefore, a force for pushing the metal terminal so as to elastically deform the lock projections as in the usual structure is not needed, and the efficiency of the operation can be enhanced. And besides, as compared with the lock structure utilizing the elastic force, the retaining force can be made higher, and the retained condition of the metal terminal is less liable to be canceled, and furthermore fatigue due to the repeated operations will not occur, and the disengagement of the metal terminal caused by the decrease of the retaining force can be prevented.

DETAILED DESCRIPTION OF THE PREFERRED EMBODIMENTS

A preferred embodiment of an electric connection box of the present invention will now be described with reference to the drawings.

Figure 1:
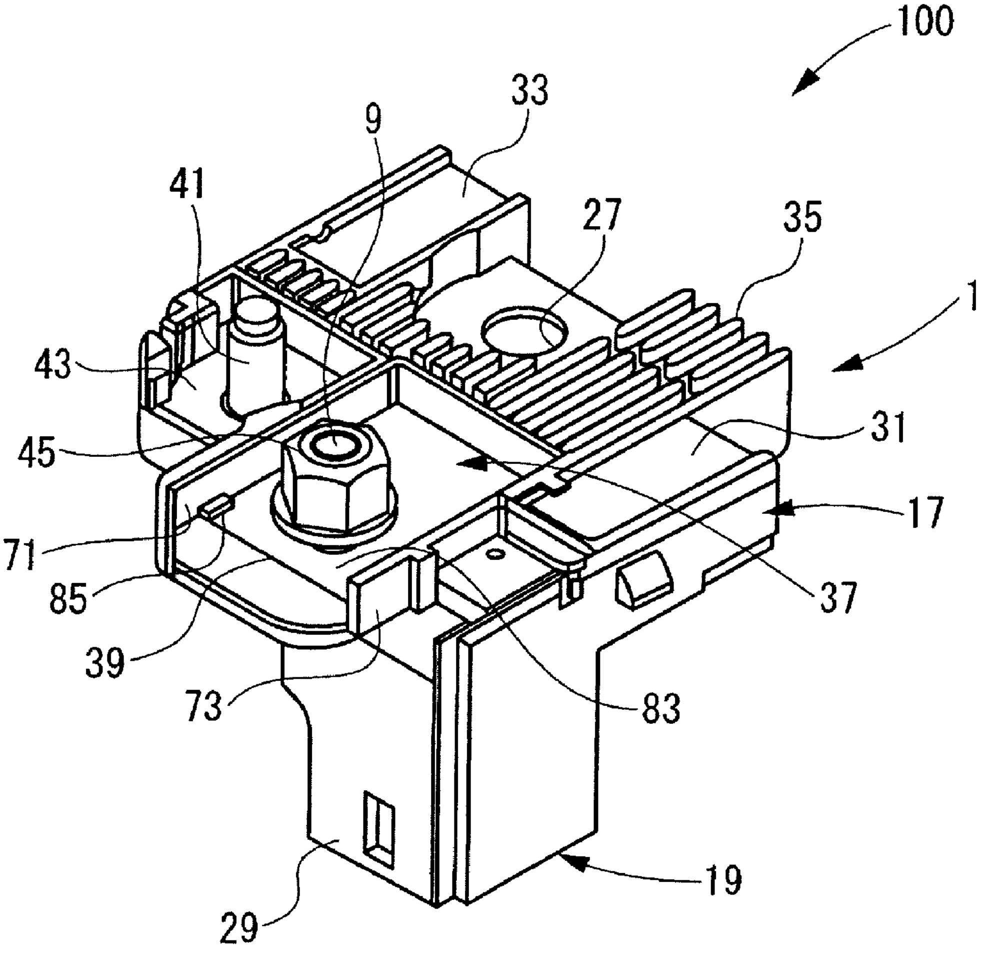
FIG. 1 is a perspective view of an electric connection box according to an embodiment of the present invention, showing its appearance.
Figure 2:
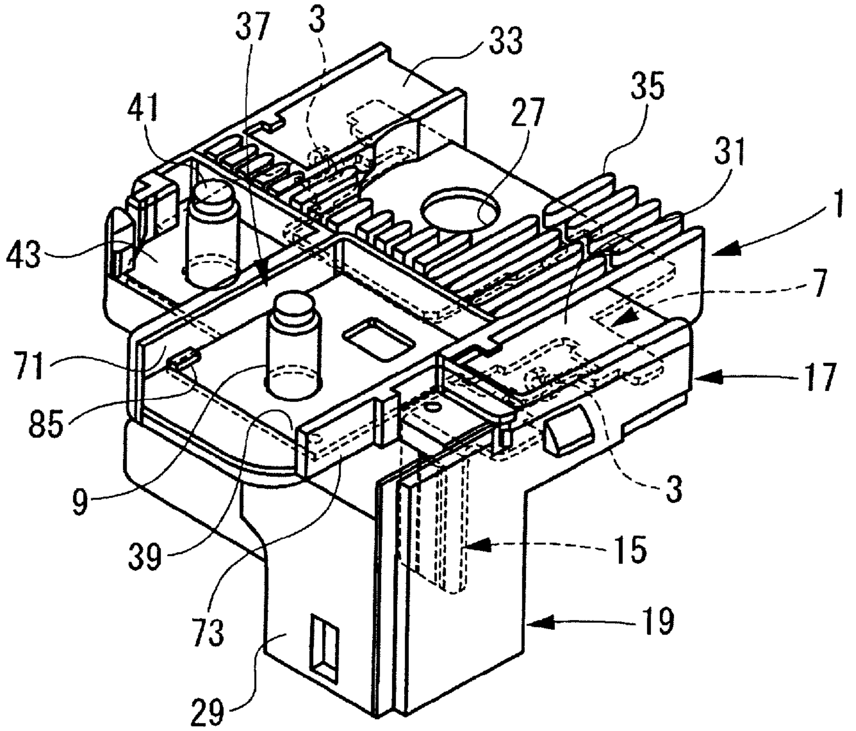
FIG. 2 is a perspective view of the electric connection box of FIG. 1, showing a metal plate member (provided within the electric connection box) in broken lines.
Figure 3:
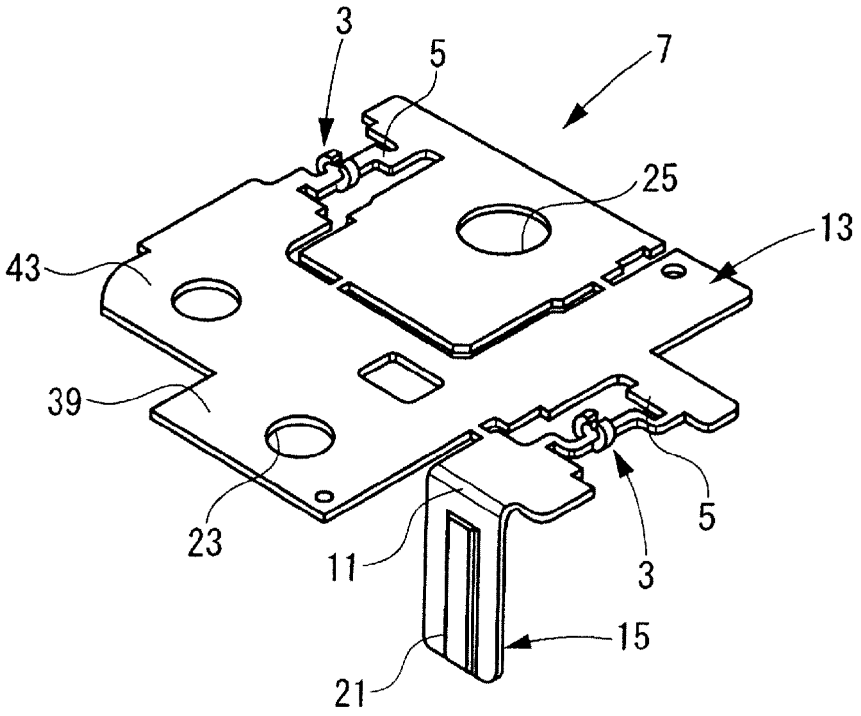
FIG. 3 is a perspective view of the metal plate member of FIG. 2.

FIG. 1 is a perspective view of the electric connection box according to an embodiment of the invention, showing its appearance, FIG. 2 is a perspective view of the electric connection box, showing a metal plate member (provided within the electric connection box) in broken lines, and FIG. 3 is a perspective view of the metal plate member of FIG. 2.

In the embodiment, the electric connection box is the generic name for a fuse block (including a fuse unit), a relay box, a junction box and the like. The electric connection box 100 of this embodiment includes a box body 1 made of an insulative resin material, a fuse element 7 having fusible portions 3 formed respectively at bus bars 5, and a terminal connection bolt 9, the fuse element 7 and the terminal connection bolt 9 being integrally molded in the box body 1. The fuse element 7 is blanked from a single electrically-conductive metal sheet (or plate), and has an integral flexible hinge 11. The hinge 11 can be bent in a direction of a thickness of the metal sheet.

The fuse element 7 includes one plate portion 13, the other plate portion 15, and the hinge 13 (shown in FIG. 3) disposed at the boundary between the two plate portions 13 and 15. Resin bodies 17 and 19 (shown in FIG. 2) made of an insulative synthetic resin material are integrally molded (for example, by insert molding) on obverse and reverse sides of the two plate portions 13 and 15 of the fuse element 17 extended into a flat plate-like condition (although not shown). The hinge 11 of the fuse element 7 is disposed at a portion of a resin-molding tool (mold) (not shown) into which the molten resin material is not poured, and by doing so, the hinge 11 is exposed without being covered by the resin bodies 17 and 19. Namely, the whole resin body is divided into two sections, that is, the resin bodies 17 and 19, with the hinge 11 interposed therebetween.

The plurality of (two in the illustrated embodiment) bus bars 5 are formed at the one plate portion 13 of the fuse element 7. A tab terminal 21 is formed at an end portion of the other plate portion 15. In this embodiment, the other plate portion 15 itself defines the tab terminal 21. In the fuse element 7, the tab terminal 21 is bent or turned downwardly through the hinge 11 as shown in FIG. 3. A bolt passage hole 23 for terminal connecting purposes is formed through the one plate portion 13. Also, a bolt passage hole 25 for battery connecting purposes is formed through an end portion of the one plate portion 13. The bolt passage hole 25 is aligned with a bolt passage hole 27 formed in the box body 1.

A connector housing portion 29 receiving the tab terminal 21 therein is integrally molded with the resin body 19 having the fuse element 7 insert molded therein. The tab terminal 21 projects into a connector fitting chamber of the connector housing portion 29. A plurality of (two) fuse receiving spaces 31 and 33 are formed in the resin body 17. The upper sides of the fuse receiving spaces 31 and 33 are covered by a cover (which is not shown and has transparent window portions) attached to the resin body 17 by retaining means. A plurality of heat-radiating fins 35 are formed integrally on the resin body 17 covering the one plate portion 13.

Retaining means are provided respectively at the resin bodies 17 and 19, and when the whole resin body is bent through the hinge 11 such that the resin bodies 17 and 19 are disposed at an angle of 90 degrees relative to each other, these retaining means are opposed to each other to be retainingly engaged with each other. In the box body 1, when the resin bodies 17 and 19 are thus disposed at the angle of 90 degrees relative to each other as a result of the bending operation, one resin body 17 is disposed parallel to an upper surface of a battery (not shown), while the other resin body 19 is disposed parallel to a vertical surface of the battery.

Therefore, in the electric connection box 100, the fuse receiving spaces 31 and 33 can be easily disposed horizontally, and also the amount of projecting in the horizontal direction is reduced, so that a space-saving design in an engine room can be achieved. Furthermore, the resin bodies 17 and 19 can be integrally molded on the fuse element 7 developed into a plane, and therefore the molding tool (mold) can be more simplified and reduced in cost as compared with the case where the resin bodies 17 and 19 are molded on the bent fuse element 7.

Figure 4:
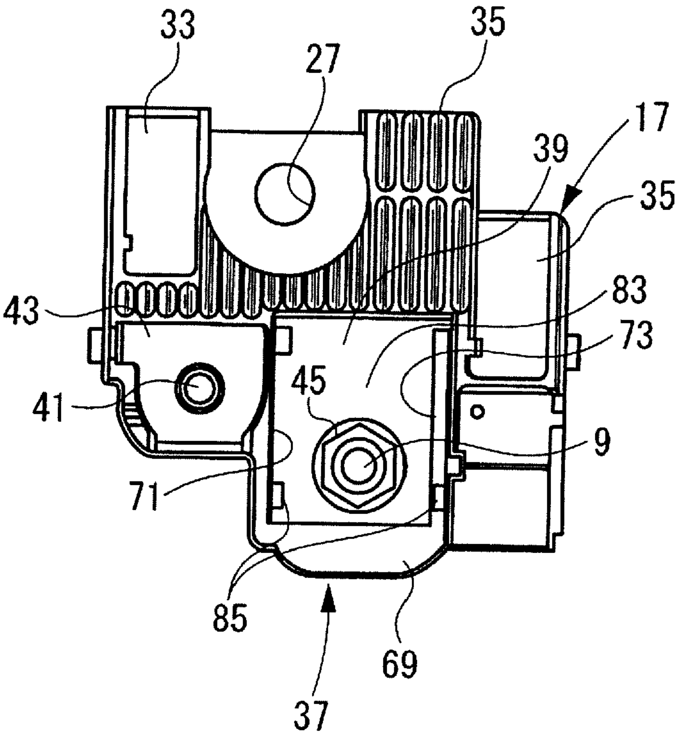
FIG. 4 is a plan view of the electric connection box of FIG. 1.
Figure 5:
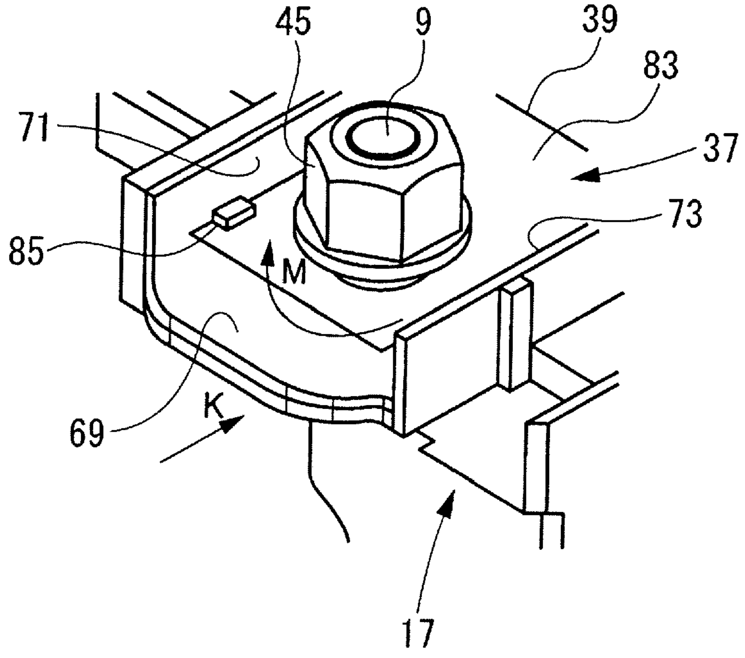
FIG. 5 is an enlarged perspective view of a terminal mounting portion shown in FIG. 4.
Figure 6:
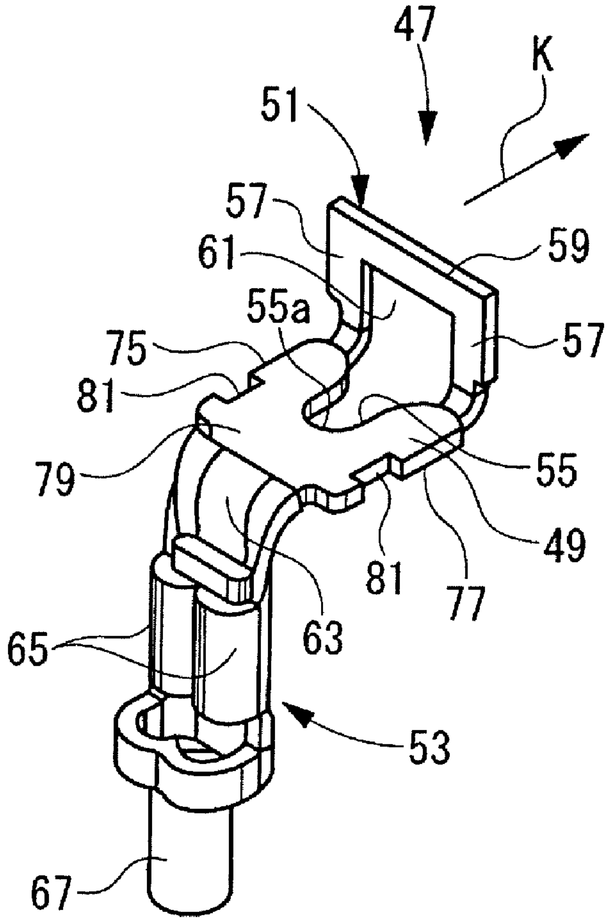
FIG. 6 is a perspective view of a metal terminal.

FIG. 4 is a plan view of the electric connection box shown in FIG. 1, FIG. 5 is an enlarged perspective view of a terminal mounting portion shown in FIG. 4, and FIG. 6 is a perspective view of a metal terminal.

The portion of the electric connection box 1 disposed in the vicinity of an upstanding terminal connection bolt 9 is the terminal mounting portion 37. In the terminal mounting portion 37, the portion of the fuse element 7 disposed in the vicinity of (or around) the terminal connection bolt 9 (to be molded in the box body 1) is set at a portion of the resin-molding tool (not shown) into which the molten resin material is not poured, and therefore is exposed without being covered by the resin bodies 17 and 19. This exposed portion of the fuse element 7 defines a connection portion 39 with which the metal terminal 47 (described later) is contacted. Another terminal connection bolt 41, and another connection portion 43 are provided.

A nut 45 serving as a fastening portion is threaded on the terminal connection bolt 9. The nut 45, while having a nylon resin for provisionally-fixing to the terminal connection bolt 9, allows the insertion of the metal terminal 47.

As shown in FIG. 6, the metal terminal 47 is formed into a one-piece, and includes a flat electrical contact portion 49, a reinforcing bridge portion 51, a wire connection portion 53. The electrical contact portion 49 has a rectangular shape when viewed from the top. A notch 55 for the passage of the terminal connection bolt 9 therethrough is formed in the electrical contact portion 49. The notch 55 extends inwardly from an outer edge of the electrical contact portion 49. The electrical contact portion 49 is slid in a direction of arrow K along a direction of extending of the notch 55, so that the terminal connection bolt 9 is passed through the notch 55. The portion of the electrical contact portion 49 disposed in the vicinity of an inner end 55*a* of the notch 55 is held between the nut 45 and the connection portion 39.

The reinforcing bridge portion 51 includes a pair of upstanding portions 57 and 57, and an interconnecting portion 59 formed integrally with and interconnecting the upstanding portions 57 and 57. In the reinforcing bridge portion 51, the pair of upstanding portions 57 and 57 are interconnected by the interconnecting portion 59, and with this construction the width of the notch 55 is prevented from being changed. Namely, the reinforcing bridge portion 51 increases the rigidity (strength) of the electrical contact portion 49. An entry port 61 through which the terminal connection bolt 9 and the nut 45 are fitted into the notch 55 is formed by the pair of upstanding portions 57 and 57 and the interconnecting portion 59.

The wire connection portion 53 includes a bottom plate portion 63, and a plurality of press-fastening piece portions 65. An angle formed by the bottom plate portion 63 and the electrical contact portion 49 is generally 90 degrees. The press-fastening piece portions 65 cooperate with the bottom plate portion 63 to hold a wire 67 therebetween.

Retaining grooves 81 are formed in a terminal rear portion 79 of the electrical contact portion 49. In this embodiment, the pair of retaining grooves 81 each in the form of a generally U-shaped notch are formed respectively in opposite side edges 75 and 77 of the terminal rear portion 79. Only one retaining groove 81 may be provided. Each retaining groove 81 can have any other suitable shape having a square shape and a round shape, and also can be replaced by a through hole. More than two retaining grooves 81 may be provided. The retaining grooves 81 are engaged respectively with retaining ribs 85 (described later) provided at the connection portion 39, thereby preventing the metal terminal 47 from being disengaged from the connection portion 39 (that is, from being moved away from the connection portion 39 in a direction opposite to the terminal inserting direction).

A flange-shaped support plate 69 is formed in a projecting manner at a terminal insertion port of the terminal mounting portion 37. The support plate 69 supports a rear edge portion of the electrical contact portion 49 of the metal terminal 47. In the electric connection box 100, the electrical contact portion 49 of the metal terminal 47 is slid into a gap between the connection portion 39 of the terminal mounting portion 37 and the nut 45 threaded on the terminal connection bolt 9 extending upright at a central portion of the connection portion 39, and is held and fixed between the connection portion 39 and the nut 45.

A pair of restricting walls 71 and 73 formed integrally with the resin body 17 are disposed in an upstanding manner respectively at right and left sides of the connection portion 39. The restricting walls 71 and 73 abut respectively against the opposite side edges 75 and 77 of the metal terminal 47 to restrict or prevent the metal terminal 47 from being rotated about the axis of the bolt 9.

The retaining ribs 85 are disposed on an upper surface 83 of the connection portion 39 of the terminal mounting portion 37, and the retaining ribs 85 project from the upper surface 83. As described above, the retaining ribs 85 are retainingly engaged respectively in the retaining grooves 81 to prevent the metal terminal 47 from being disengaged from the connection portion 39. The retaining ribs 85 can be formed in a projecting manner on the upper surface 83 of the connection portion 39. The term "to form the retaining ribs 85 in a projecting manner on the upper surface 83" means that the relevant portions of the upper surface 83 are raised or bulged to form the respective retaining ribs 85. By thus forming the retaining ribs 85 directly on the upper surface 83 in a projecting manner, the strength of the retaining ribs 85 in the terminal withdrawing direction can be increased. The retaining ribs 85 can be formed by projecting the relevant portions of the electrically-conductive metal sheet forming the connection portion 39. In another modification, the retaining ribs can be formed on the resin body 17 integrally molded on the electrically-conductive metal sheet forming the connection portion 39. Namely, the resin body 17 is molded such that the relevant portions of the molded resin body 17 form the retaining ribs 85, respectively.

In a further modification, the retaining ribs 85 can be formed on and project respectively from the restricting walls 71 and 73 to be disposed on the upper surface 83, as shown in FIG. 4. Namely, the retaining ribs 85 project respectively from inner surfaces of the left and right restricting walls 71 and 77, and are disposed on the electrically-conductive metal sheet forming the connection portion 39. Namely, the retaining ribs 85 are not fixed to the electrically-conductive metal sheet. With this laterally-projecting structure, the retaining ribs 85 can be disposed at an intermediate portion of the rearwardly-extending electrically-conductive metal sheet, and the electrically-conductive metal sheet having an arbitrary wide area which is not limited by the positions of the retaining ribs 85 can be provided.

Preferably, the retaining ribs 85 are provided respectively at the opposite side portions of the connection portion 39 such that the nut 45 is disposed midway between the retaining ribs 85. When the metal terminal 47 is to be inserted between the connection portion 39 and the nut 45, opposite side edge portions of the lower surface of the metal terminal 47 slide respectively on the left and right retaining ribs 85 and 85, and the metal terminal 47 is inserted between the connection portion 39 and the nut 45 without being inclined in the left-right direction relative to the connection portion 39. Therefore, as compared with the case where there is provided only one retaining rib 85, and the metal terminal 47 is inserted while inclined in one direction, the metal terminal 47 is less liable to interfere with the nut 45, so that the inserting operation can be carried out efficiently.

In this embodiment, the retaining ribs 85 are provided on the connection portion 37 at a position between the terminal insertion port (entrance) for inserting the metal terminal 47 into the terminal mounting portion 37 and the nut 45. The retaining ribs 85 are thus disposed at the outer portion (the terminal insertion port side) of the connection portion 39, and with this arrangement the retaining ribs 85 can be easily confirmed with the eyes, and for example as compared with the case where the retaining ribs 85 are disposed at an inner portion of the connecting portion 39, the metal terminal 47, when inserted, will not abut against the retaining ribs 85 and will not be caught by the retaining ribs 84, so that the inserting operation can be carried out efficiently.

Next, the operation of the electric connection box having the above construction will be described.

Figure 7C:
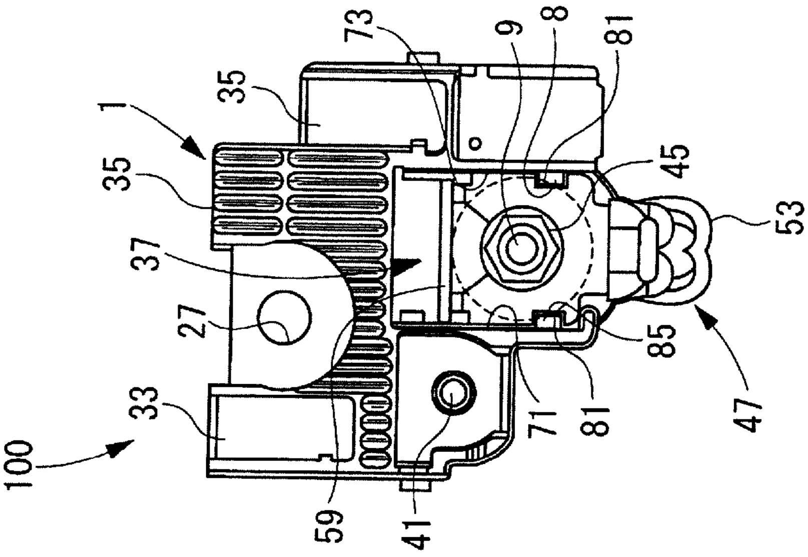
FIGS. 7A to 7C show sequential steps of a process of mounting the metal terminal on the terminal mounting portion.
Figure 7B:
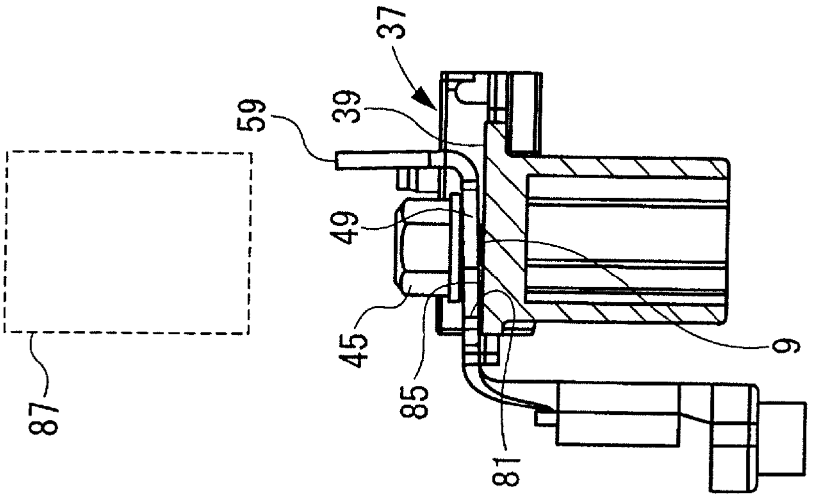
Figure 7A:
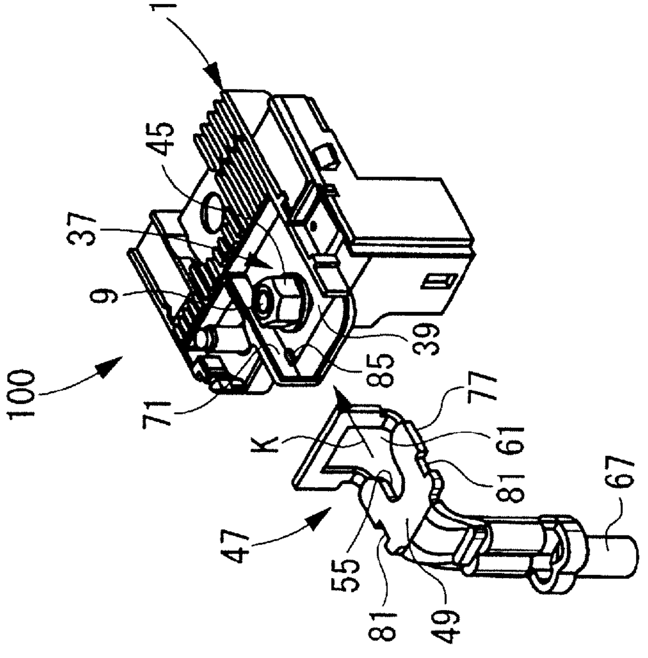
Figure 8:
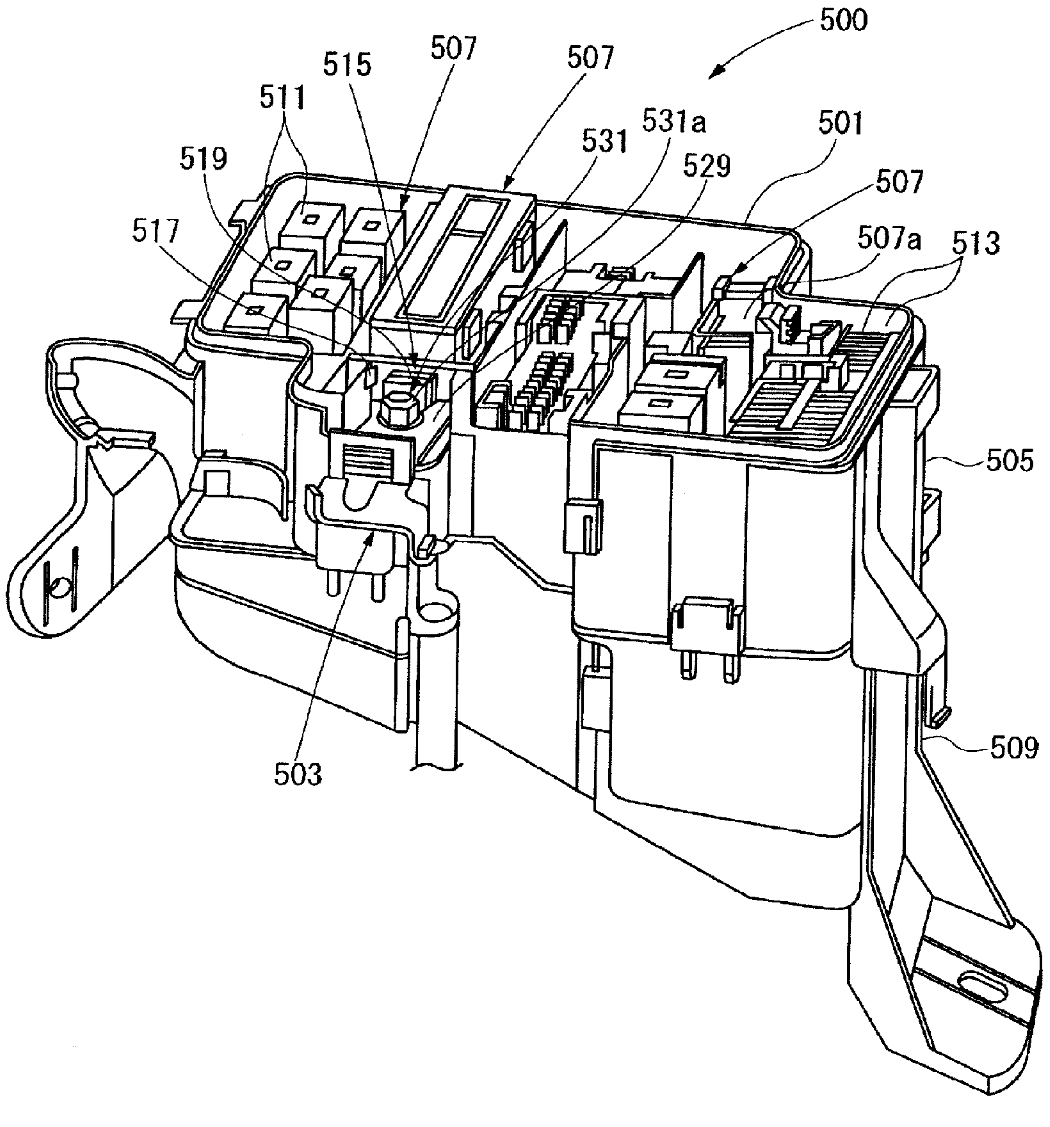
PRIOR ART FIG. 8
FIG. 8 is a perspective view of a usual electric connection box.
Figure 9:
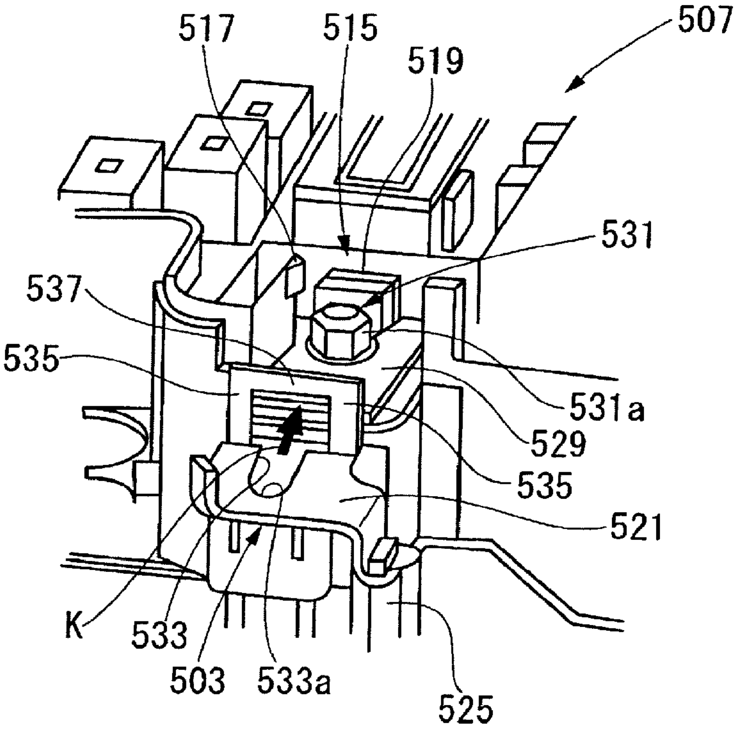
PRIOR ART FIG. 9
FIG. 9 is an enlarged perspective view of a terminal mounting portion shown in FIG. 8.
Figure 10:
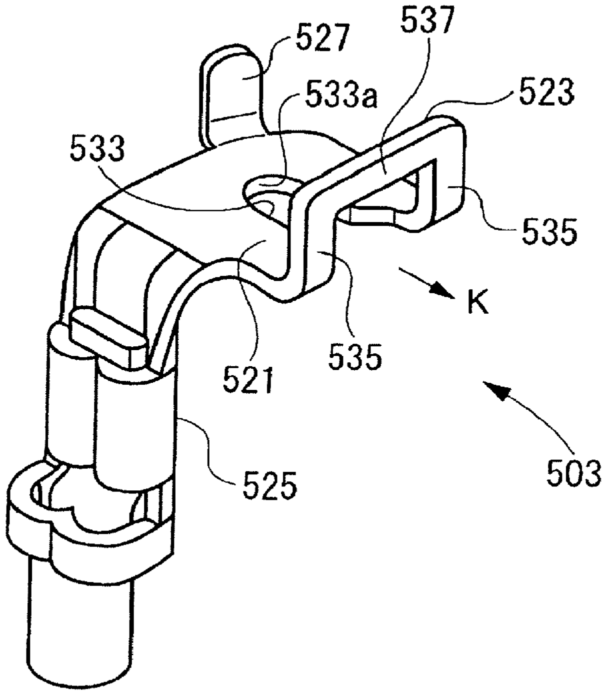
FIG. 10 PRIOR ART
FIG. 10 is a perspective view of a metal terminal shown in FIG. 8.

FIGS. 7A to 7C show sequential steps of the process of mounting the metal terminal on the terminal mounting portion.

For electrically connecting the wire 67 to the electric connection box 100, the metal terminal 47 press-fastened or crimped to an end portion of the wire 67 is inserted into the terminal mounting portion 37 of the box body 1 as shown in FIG. 7A. In the inserting operation, the electrical contact portion 49 is inserted into the gap between the connection portion 39 and the nut 45, with the nut 45 received in the entry port 61 of the metal terminal 47 and also with the terminal connection bolt 9 inserted in the notch 55.

The electrical contact portion 49 is placed at its lower surface on the retaining ribs 85 and 85, and is inserted in a slanting posture with the front portion lifted and also with the opposite side edge portions of the lower surface held in sliding contact with the respective retaining ribs 85 and 85, as shown in FIG. 7B. The restricting walls 71 and 73 restrict a lateral displacement of the opposite side edges 75 and 77 of the metal terminal 47, and the metal terminal 47 is inserted in the terminal sliding direction K parallel to the restricting walls 71 and 73. In this condition, the upper surface of the front portion of the electrical contact portion 49 is disposed in sliding contact with the lower surface of the nut 45.

When the metal terminal 47 is further inserted into the terminal mounting portion 37, the retaining grooves 81 of the electrical contact portion 49 reach the upper sides of the retaining ribs 85, respectively, and therefore the retaining ribs 85 are fitted respectively into the retaining grooves 81 because of the own weight of the metal terminal 47, so that the electrical contact portion 49 is slightly moved downward. In the condition in which the retaining grooves 81 are fitted on the respective retaining ribs 85, the upper surface of the front portion of the electrical contact portion 49 is kept in abutting contact with the lower surface of the nut 45. Namely, the retaining engagement of the retaining grooves 81 with the respective retaining ribs 85 is maintained, and the rearward disengagement (or movement) of the metal terminal 47 is prevented.

In the provisionally-retained condition, the nut 45 is rotated in a tightening direction (clockwise direction in FIG. 7C) by a tool 87 such as a box screwdriver. When the nut 45 is thus rotated, the gap between the nut 45 and the connection portion 39 is reduced, and the retaining engagement of the retaining grooves 81 with the respective retaining ribs 85 becomes more positive. At this time, although the metal terminal 47 tends to rotate together with the nut 45 because of a moment produced by friction, the opposite side edges 75 and 77 of the metal terminal 47 abut respectively against the restricting walls 71 and 73, and therefore the rotation of the metal terminal 47 is prevented. Therefore, cancellation of the retained condition which would occur as a result of lifting of the terminal rear portion 79 will not occur, and the disengagement of the metal terminal 47 during the terminal fastening operation is prevented.

When the terminal connection bolt 9 does not yet reach the inner end 55*a* of the notch 55 as shown in FIG. 7B, the interconnecting portion 59 disposed near to the nut 45 interferes with the tool 87 such as a box screwdriver to prevent the tightening operation. Thus, the metal terminal 47, when disposed in a half-inserted condition, is prevented from being fastened.

As described above, in the electric connection box 100, when the metal terminal 47 is inserted between the nut 45 and the connection portion 39, the opposite side edge portions of the lower surface of the front portion of the metal terminal 47 slide respectively on the retaining ribs 85, and when the metal terminal 47 reaches the predetermined position, the retaining grooves 81 are disposed in registry with the retaining ribs 85, respectively, and the retaining ribs 85 are fitted respectively into the retaining grooves 81, so that the metal terminal 47 is moved downward (toward the connection portion 37), thereby preventing the metal terminal 47 from moving in the inserting/withdrawing direction (that is, retaining the metal terminal 47 against movement in the inserting/withdrawing direction). Therefore, a force for pushing the metal terminal 47 so as to elastically deform the lock projections as in the conventional structure is not needed. And besides, as compared with the conventional lock structure utilizing the elastic force, the higher retaining force can be obtained, and also fatigue due to the repeated operations is less liable to occur.

Thus, in the electric connection box 100 of the above embodiment, the retaining ribs 85 are disposed at the upper surface 83 of the connection portion 39, and the retaining grooves 81 for engagement respectively with the retaining ribs 85 are formed in the metal terminal 47. Therefore, the force for pushing the metal terminal 47 is not needed, and the efficiency of the operation can be enhanced. And besides, as compared with the lock structure utilizing the elastic force, the retaining force can be made higher, and the retained condition of the metal terminal is less liable to be canceled, and furthermore fatigue due to the repeated operations will not occur, and the disengagement of the metal terminal 47 caused by the decrease of the retaining force can be prevented.

What is claimed is:

1. An electric connection box, comprising:

a terminal mounting portion which includes a connection portion and a fastening portion provided on the connection portion;

a metal terminal slid to be held and fixed between the connection portion and the fastening portion;

a pair of restricting walls which are upstandingly provided on the connection portion, and abut respectively against opposite side edges of the metal terminal to restrict the rotation of the metal terminal;

a retaining rib which is disposed on a surface of the connection portion and projects from the surface; and a retaining groove which is formed in the metal terminal, and is engaged with the retaining rib to prevent the metal terminal from being disengaged from the connection portion.

2. The electric connection box according to claim 1, wherein the retaining rib is formed on and projects from the surface of the connection portion.

3. The electric connection box according to claim 1, wherein the retaining rib projects from the restricting wall and is disposed on the surface of the connection portion.

4. The electric connection box according to claim 1, wherein a pair of the retaining ribs are provided respectively at opposite side portions of the connection portion such that the fastening portion is disposed generally midway between the pair of retaining ribs.

5. The electric connection box according to claim 1, wherein the retaining rib is provided at a position between an entrance for inserting the metal terminal into the terminal mounting portion and the fastening portion.

* * * * *